RECTANGULAR PULSE GENERATING CIRCUIT

Filed June 24, 1964

2 Sheets-Sheet 1

INVENTOR:
JOHN J. HICKEY,
BY Jerry A. Dinardo
AGENT.

INVENTOR.
JOHN J. HICKEY,
BY
AGENT.

3,249,770
RECTANGULAR PULSE GENERATING CIRCUIT
John J. Hickey, Hawthorne, Calif., assignor to TRW Inc., a corporation of Ohio
Filed June 24, 1964, Ser. No. 377,606
7 Claims. (Cl. 307—88.5)

This invention relates generally to pulse generating circuits, and more particularly to circuits capable of generating relatively high voltage rectangular pulses at high repetition rates.

An object of this invention is the provision of a rectangular pulse generating circuit capable of producing high voltage, low impedance flat topped pulses of accurately determined time duration, needed for driving capacitive loads, such as those encountered in image converter and cathode ray tubes.

A further object is the provision of a circuit capable of generating rectangular pulses of at least several hundred volts amplitude at a repetition rate in excess of 10,000 pulses per second.

Yet another object is the provision of a pulse generating circuit for producing high voltage rectangular pulses having rise and fall times less than 10 nanoseconds.

According to the invention, a charge storage means, such as a delay line, is arranged to discharge current in series with two parallel paths through a switching device. The first path has a substantially lower impedance than the second path so that initially upon closing the circuit through the switching device, substantially all the discharge current flows in the first path and little or no current flows in the second path. The first path includes a semiconductive carrier storage device which is depleted of its carriers after a predetermined time of current flow therein, so as to effectively cut off current flow in this path. The current is thereupon transferred to the second path which is now of lower impedance than the first path containing the semiconductive carrier storage device. A sharply rising voltage pulse thus builds up across a load impedance in the second path. Voltage limiting means in parallel with the load impedance limits the amplitude of the output voltage pulse, thereby producing a flat top in the pulse. The output terminates when the delay line is fully discharged.

Figure 1:
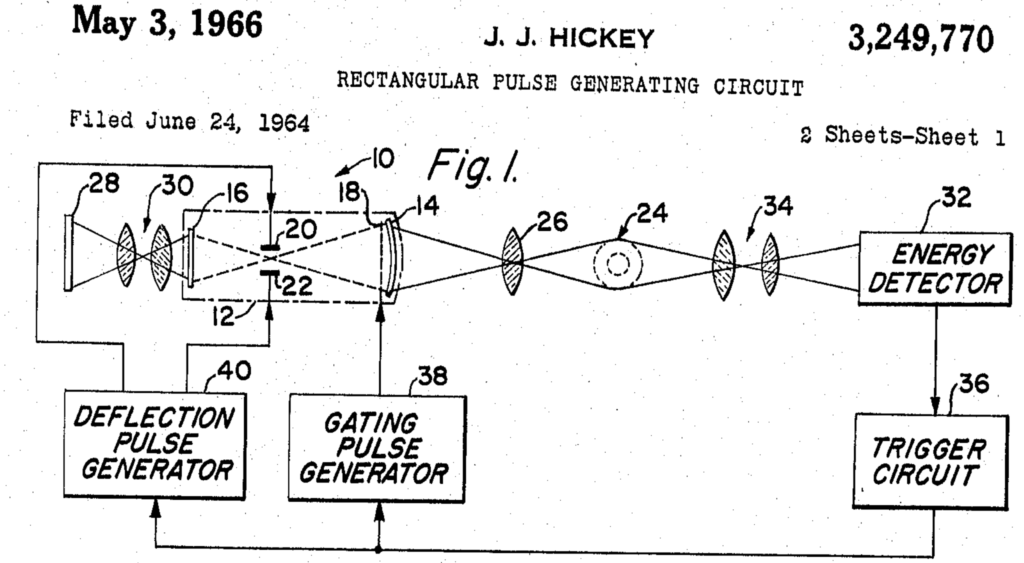
FIG. 1 is a block diagram of an electronic camera system in which the circuit of the invention finds use.

Referring now to the drawing, FIG. 1 is a block diagram of an electronic camera system employing a rectangular pulse generating circuit according to the invention. The electronic camera system includes as one of its principal components an image converter tube 10 which functions primarily as a high speed shutter. Another function of the image converter tube 10 is that of providing light amplification for the extremely short frame times involved in its high speed photographic operation.

The image converter tube 10 comprises essentially a cylindrical evacuated envelope 12 containing a photoemissive cathode or photocathode 14 at one end, a fluorescent screen 16 at the other end, a control grid 18 adjacent to the photocathode 14, and a pair of deflection plates 20 and 22 intermediate the control grid 18 and the fluorescent screen 16. Certain other parts and components essential to the operation of the tube 10 are omitted for simplicity, since these are well known. For example, the tube 10 ordinarily contains additional electrodes such as an anode and focusing electrodes and also requires a high voltage supply. It will suffice to say that the tube may be one of the kind manufactured by RCA and bearing the developmental type number C 73435A.

In the operation of the electronic camera for the purpose of photographing high speed transient phenomena, light from an object 24 is focused by a lens 26 onto the photocathode 14 of the image converter tube 10. The electron image emitted from the photocathode 14 is normally prevented from reaching the fluorescent screen 16 by the application of a sufficiently high negative blanking voltage to the control grid 18 relative to the photocathode 14.

A rapid series of frames or exposures of the phenomenon or object 24 can be taken by applying a series of positive rectangular gating voltage pulses to the control grid 18. The gating voltage pulses are sufficiently large, such as 300 volts, to unblank the grid 18 and permit the electron image to be accelerated towards the fluorescent screen 16. The different frames or exposures may be reproduced side-by-side on the fluorescent screen 16 by applying deflection voltages to the deflection plates 20 and 22 respectively, between and during successive gating pulses. The amplified light images appearing on the fluorescent screen 16 are then projected onto a photographic film 28 by means of a lens system 30. In practice, the film 28 may be part of a camera of the type which allows rapid development of the exposed film 28.

A gating signal for actuating the image converter tube 10 is developed in a circuit which includes an electromagnetic energy detector 32 exposed through a lens system 34 to the phenomenon or object 24 to be recorded. The beginning of the event, for example, may be manifested by the initial emission of light from the object 24. In such case, the detector 32 may comprise a phototube circuit which converts the light into an electrical signal. The electrical signal is fed to a trigger circuit 36 to develop an amplified trigger pulse or a series of pulses of sufficient magnitude to drive a gating pulse generator 38 and a deflection pulse generator 40 which generate the desired gating and deflection pulses for operating the image converter tube.

Figure 2:
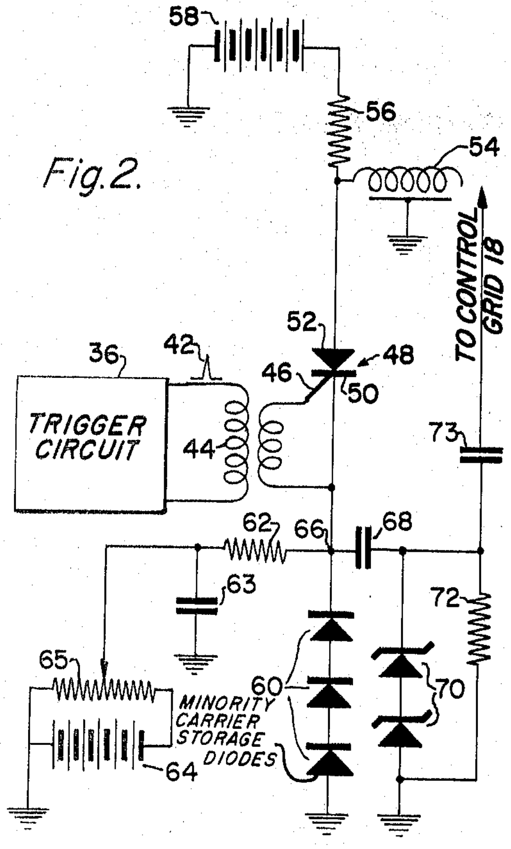
FIG. 2 is a schematic circuit showing one embodiment of a rectangular pulse generating circuit according to the invention.

Reference is now made to FIG. 2 which shows the rectangular gating pulse generator 38 of the invention in greater detail. The output trigger pulse 42 from the trigger circuit 36 is fed to the primary winding of an isolation transformer 44. The secondary winding of the transformer 44 is connected between the gate electrode 46 and the cathode 50 of a silicon controlled rectifier 48 that serves as a switching device. Alternatively, a thyratron may be used in place of the rectifier 48. The anode 52 of the rectifier 48 is connected to one side of a storage device or delay line 54, the other side of which is grounded. The delay line 54 is charged to a positive potential through a charging resistor 56 in series with a direct current voltage source 58. The charging resistor 56 is selected to be as small as possible while still limiting the current through the silicon controlled rectifier 48 below the breakdown level.

The rectifier 48 is connected in series with one or more semiconductive diodes 60 which exhibit minority carrier storage. The number of diodes 60 required depends upon their breakdown voltage relative to the total amount of voltage they are required to withstand. In a specific example, 3 type 1N992 step recovery diodes may be used to hold off 300 volts. Alternatively, a single high voltage varactor diode may be used for the same voltage. The diodes 60 are biased in their forward direction of current flow through a low impedance load resistor 62 in series with a negative bias supply comprising bias source 64 and a potentiometer 65. Capacitor 63 is connected from the arm of potentiometer 65 to ground to provide a low impedance bypass.

The junction point 66 of the load resistor 62 and the diodes 60 is coupled through a coupling capacitor 68 in series with a voltage limiting means 70 comprising a pair of zener diodes. A resistor 72 connected across the voltage limiting means 70 serves as a discharge path for capacitor 68. The output voltage developed across the voltage limiting means 70 is coupled through a coupling capacitor 73 to the control grid 18 of the image converter tube 10.

The operation of the rectangular pulse generating circuit will now be described. In the absence of a trigger pulse 42, the silicon controlled rectifier 48 is nonconducting. The diodes 60 conduct in their forward direction an amount of current determined by the setting of potentiometer 65 and the voltage of the bias supply 64. The delay line 54 is charged to a D.C. voltage less than that of the voltage source 58. The value of voltage on the delay line 54 is determined by the breakdown voltage between the anode and cathode of the silicon control rectifier 48, which serves as a voltage regulator in this regard. With no trigger pulse applied to the gate electrode 46 of the rectifier 48, the latter serves as an open switch between the delay line 54 and the junction point 66 between one path comprising the diodes 60 and another path comprising the load resistor 62 in series with the capacitor 63 to ground. With the diodes 60 conducting in their forward direction the junction point 66 is at a small negative potential due to a small voltage drop across the diodes 60.

When a trigger pulse 42 is applied to the transformer 44 and coupled therethrough to the gate electrode 46 of the rectifier 48, the latter conducts. A discharge path for the delay line 54 is provided through the rectifier 48 in series with the diodes 60 for a short time during which minority carriers are stored in the diodes 60. That is, current can flow in the reverse direction through the diodes until the minority carriers stored therein are depleted. During the period that the carriers are still present, the diodes 60 have a much lower impedance relative to the impedance of the parallel path comprising the low impedance load resistor 62 and the capacitor 63. Therefore, most of the discharge current flows through the diodes and only a small portion flows through the load resistor 62.

Figure 3:
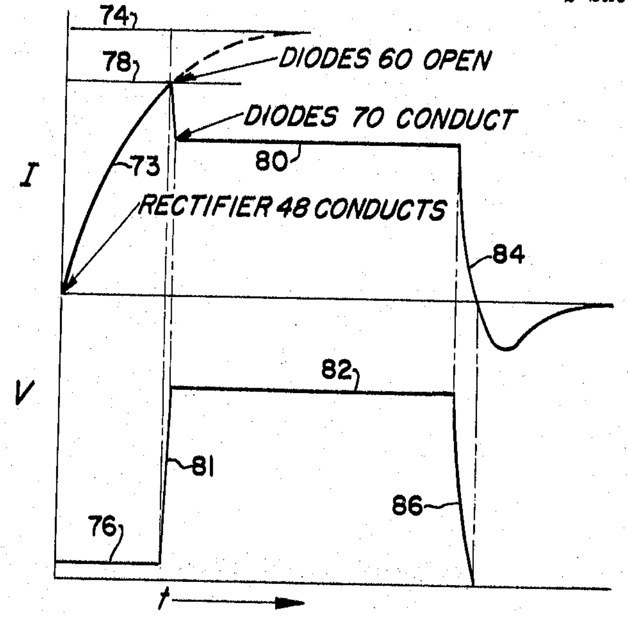
FIG. 3 is a graph of current and voltage waveforms useful in explaining the operation of the circuit of FIG. 2.

Referring to the graph of waveforms in FIG. 3, the current I through the rectifier 48 and the voltage V across the voltage limiting means 70 are plotted as a function of time. When the rectifier 48 conducts, the current I therethrough rises, as shown in curve portion 73, at a rate determined by the turn on characteristics of the rectifier 48. The current I rises towards an upper current level 74 that is determined by the voltage on the delay line 54 and the sum of the impedances of the delay line 54 and the diodes 60. As the current I is rising towards the level 74, a voltage step 76 appears at the junction 66. Due to low initial impedance of the diodes 60, this step 76 is very small.

Within several nanoseconds after the rectifier 48 conducts, the minority carriers are depleted from the diodes 60, whereupon they stop conducting and present an open circuit to the further flow therethrough of current from the delay line 54. The time at which the carriers are depleted can be adjusted to occur when the current I reaches a level 78 sufficient to produce a desired voltage across the load resistor 62. This adjustment is made by adjusting the bias level on the diodes 60 through the potentiometer 65.

When the diodes 60 stop conducting, the major portion of the discharge current I now flows through the load resistor 62. Since the resistor 62 presents a higher resistance to the delay line 54 than did the diodes 60, the discharge current I quickly falls to a level 80 that is determined by the voltage of the delay line 54, the sum of the impedances of the delay line and the load resistor 62, and the voltage level of voltage limiting means 70. The opening of the diodes 60 occurs within about 5 nanoseconds to produce a voltage rise 81 at the junction point 66 of the same order of rise time.

The voltage at the junction point 66 rises to a level that is limited by the voltage limiting means 70. When the conduction voltage of the limiting means 70 is reached, the voltage is clamped at that level to produce a flat topped voltage pulse 82 whose duration is determined by the time of discharge of the delay line 54.

Since the impedances seen by the delay line 54 during the switching operation of rectifier 48 varies from high to low impedance, the shape of the negative reflection which occurs at the end of the current pulse, indicated as a negative going portion 84 on the current wave, is dependent upon the turn on time of the rectifier 48. The trailing edge 86 of the voltage waveform has a shape similar to that of the current trailing edge 84. The repetition rate of the circuit is determined by the resistance value of the charging resistor 56 and the capacitance of the delay line 54, in addition to an inherent recovery time of about 10 microseconds for the silicon controlled rectifier.

Figure 4:
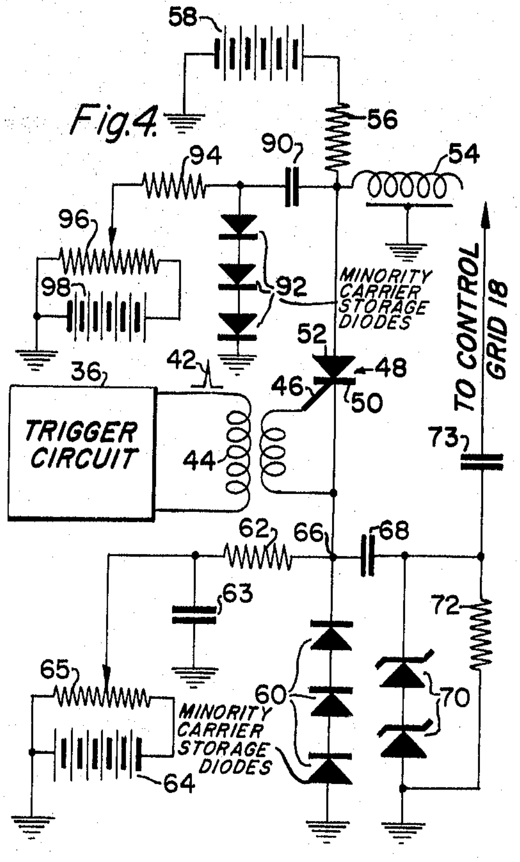
FIG. 4 is a schematic circuit showing another embodiment of a rectangular pulse generating circuit according to the invention.

An improvement in the shape of the output voltage pulse can be realized through the use of the circuit shown in FIG. 4. The improved circuit is similar to that of FIG. 2, except that a minority carrier storage circuit of the kind employed in the cathode circuit of the silicon controlled rectifier 47 is also connected in the anode circuit of the rectifier 48. As shown, the anode 52 is connected through a capacitor 90 to the junction between three series connected semiconductive diodes 92, similar to the diodes 60 of FIG. 2, and a current limiting resistor 94 connected to the variable arm of a potentiometer. 96. The potentiometer 96 is connected across a positive bias supply 98.

Figure 5:
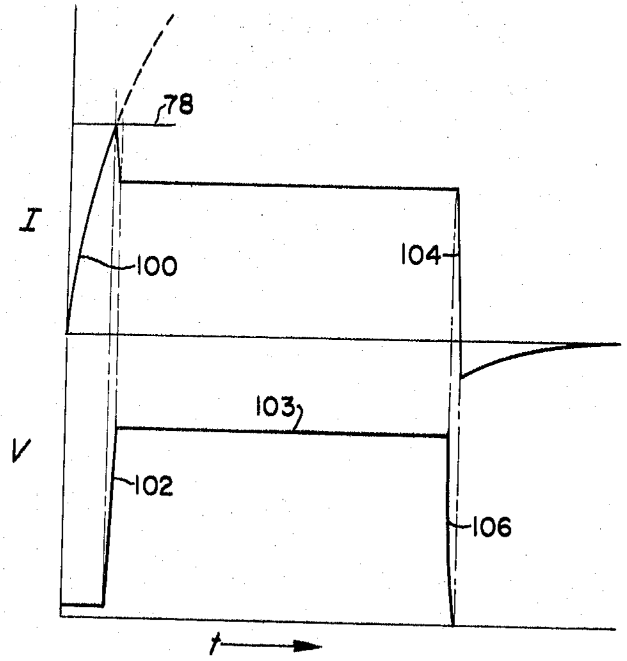
FIG. 5 is a graph of current and voltage waveforms useful in explaining the operation of the circuit of FIG. 4.

When the rectifier 48 conducts, the latter now sees the low impedance of the semiconductive diodes 92 in shunt with the delay line 54. The current I, shown in the rising curve portion 100 of the current waveform of FIG. 5, now driven by diodes 92 through capacitor 90 rises towards a higher level than did the current shown in curve portion 73 of FIG. 3. Accordingly, the current rises at a faster rate until the stored carriers in diodes 60 and 92 are depleted, as at current level 78.

When the carriers are depleted, the delay line 54 discharges through the rectifier 48 into the load resistor 62 to produce a voltage rise 102 and a flat topped pulse 103. Since the rectifier 48 was switched to conduction by the energy in the charge storage diodes 60 and 92, rather than the energy of the delay line 54, the rectifier 48 appears to the delay line 54 as an extremely fast switch with a turn on time equal to the step recovery time of the diodes 60 and 92. Thus not only are the rise times of the current and voltage waveforms very fast, but also the fall times of the current and voltage waveforms are considerably shortened, as indicated by the waveform portions 104 and 106, respectively.

In accordance with an operative embodiment, the following circuit values were used in a circuit according to FIG. 2:

| | |
|---|---|
| Trigger pulse **42** | 5 volts. |
| Transformer **44** | 1:1 pulse transformer. |
| Silicon controlled rectifier **48** | Type MCR 1304–6. |
| Delay line **54** | 6–100 ft. RG174 coaxial cable. |
| Resistor **56** | 50K—1 meg. |
| Voltage source **58** | 1700 volts D.C. |
| Semiconductive diodes **60** | (3) type 1N992. |
| Resistor **62** | 100 ohms. |
| Capacitor **63** | 1 microfarad, 100 volts D.C. |
| Bias source **64** | 30 volts D.C. |
| Potentiometer **65** | 5K. |
| Capacitor **68** | .1 microfarad, 500 volts D.C. |
| Voltage limiting means **70** | (2) type 1N988 Zener diodes. |
| Resistor **72** | 1000 ohms. |
| Capacitor **73** | .001 microfarad, 500 volts D.C. |

The following additional values may be used in a circuit according to FIG. 4:

| | |
|---|---|
| Capacitor **90** | 100 picofarads. |
| Diodes **92** | (3) type 1N992. |
| Resistor **94** | 500 ohms. |
| Potentiometer **96** | 5K. |
| Bias supply **98** | 30 volts D.C. |

With the foregoing circuit values, an output voltage pulse may be generated having an amplitude of 270 volts, 10 nanoseconds maximum rise and fall times, pulse width ranging from 10 to 300 nanoseconds, at a repetition rate in excess of 10,000 pulses per second.

The embodiments of the invention in which an exclusive property or privilege is claimed are defined as follows:

1. A pulse generating circuit, comprising:
charge storage means;
a low impedance means in circuit with said charge storage means;
a high impedance means in circuit with said charge storage means;
means for causing unidirectional current to flow in said low and high impedance means from said storage means;
means for interrupting current flow in said low impedance means when the current therein has attained a predetermined level, thereby to increase the current in said high impedance means and the voltage thereacross; and
means for limiting the voltage developed across said high impedance means.

2. A rectangular pulse generating circuit, comprising:
a delay line;
means for charging said delay line to a predetermined direct current voltage;
a first conductive path and a second conductive path of higher impedance than said first path in parallel therewith;
normally open switch means connecting said parallel conductive paths in series with said delay line;
means connected to apply a signal for closing said switch means, thereby to cause said delay line to initially discharge a substantially higher current through said first path than through said second path;
means for abruptly increasing the impedance in said first path to interrupt current flow therethrough and increase the current in said second path, thereby to develop a sharply rising voltage pulse across said parallel paths; and
means for limiting the amplitude of said voltage pulse.

3. A rectangular pulse generating circuit, comprising:
a delay line;
means for charging said delay line to a predetermined direct current voltage;
first and second parallel conductive paths;
said first path including semiconductive minority carrier storage means having forward and reverse directions of current flow and said second path including means for biasing said minority carrier storage means in the forward direction thereby to establish a condition of minority carrier storage therein;
switch means operable to connect said parallel paths conductively in series with said delay line, with said minority carrier storage means connected in the reverse direction of current flow from said delay line, whereby upon operation of said switch means said delay line is discharged initially into said first path until the carriers in said minority carrier storage means are depleted;
said minority carrier storage means presenting a high impedance to current flow when the minority carriers are depleted, thereby producing a sharply rising voltage pulse across said parallel paths which terminates upon full discharge of said delay line.

4. A rectangular pulse generating circuit, comprising:
a delay line;
means for charging said delay line to a predetermined direct current voltage;
a first conductive path and a second conductive path of higher impedance than said first path in parallel therewith;
normally open silicon controlled rectifier means having a gate electrode and connecting said parallel conductive paths in series with said delay line;
means connected to apply a signal to the gate electrode of said silicon controlled rectifier means, thereby to cause said delay line to initially discharge a substantially higher current through said first path than through said second path;
means for abrutly increasing the impedance in said first path to interrupt current flow therethrough and increase the current in said second path, thereby to develop a sharply rising voltage pulse across said parallel paths; and
means for limiting the amplitude of said voltage pulse.

5. A pulse generating circuit, comprising:
charge storage means;
a low impedance means in circuit with said charge storage means;
a high impedance means in circuit with said charge storage means;
means for causing unidirectional current to flow in said low and high impedance means from said storage means;
semiconductive minority carrier storage means forming part of said low impedance means for interrupting current flow in said low impedance means when the current therein has attained a predetermined level, thereby to increase the current in said high impedance means and the voltage thereacross;
and means for limiting the voltage developed across said high impedance means.

6. A rectangular pulse generating circuit, comprising:
a delay line;
means for charging said delay line to a predetermined direct current voltage;
first and second parallel conductive paths;
said first path including semiconductive minority carrier storage means having forward and reverse directions of current flow and said second path including means for biasing said minority carrier storage means in the forward direction thereby to establish a condition of minority carrier storage therein;

silicon controlled rectifier means operable to connect said parallel paths conductively in series with said delay line, with said minority carrier storage means connected in the reverse direction of current flow from said delay line, whereby upon operation of said rectifier means said delay line is discharged initially into said first path until the carriers in said minority carrier storage means are depleted;

said minority carrier storage means presenting a high impedance to current flow when the minority carriers are depleted, thereby producing a sharply rising voltage pulse across said parallel paths which terminates upon full discharge of said delay line.

7. The invention according to claim 6, and further including a circuit, in shunt with said delay line, which comprises a capacitor in series with second semiconductive minority carrier storage means having forward and reverse directions of current flow;

said circuit including means for biasing said second semiconductive minority carrier storage means in the forward direction;

whereby upon operation of said rectifier means, said capacitor partially discharges in series with both said first mentioned and second semiconductive carrier storage means and said silicon controlled rectifier means before said delay line discharges.

References Cited by the Examiner

UNITED STATES PATENTS

| | | | |
|---|---|---|---|
| 3,100,872 | 8/1963 | Hickey et al. | 328—67 |
| 3,168,654 | 2/1965 | Lewis | 307—88.5 |

ARTHUR GAUSS, *Primary Examiner.*

J. ZAZWORSKY, *Assistant Examiner.*